United States Patent
Guessford

(10) Patent No.: US 9,165,442 B2
(45) Date of Patent: Oct. 20, 2015

(54) ASSET RETENTION DEVICE FOR AN ASSET RETENTION SYSTEM

(71) Applicant: MARCON INTERNATIONAL, INC., Harrisburg, NC (US)

(72) Inventor: Dennis E. Guessford, Richfield, NC (US)

(73) Assignee: MARCON INTERNATIONAL, INC., Harrisburg, NC (US)

( * ) Notice: Subject to any disclaimer, the term of this patent is extended or adjusted under 35 U.S.C. 154(b) by 292 days.

(21) Appl. No.: 13/661,175

(22) Filed: Oct. 26, 2012

(65) Prior Publication Data

US 2014/0118893 A1 May 1, 2014

(51) Int. Cl.
*H05K 7/16* (2006.01)
*G08B 13/14* (2006.01)

(52) U.S. Cl.
CPC .............. *G08B 13/1445* (2013.01); *H05K 7/16* (2013.01)

(58) Field of Classification Search
CPC .. G08B 7/06; G08B 13/1409; G08B 13/1445; G08B 13/1454; H05K 5/0208
USPC .................................................... 361/679.01
See application file for complete search history.

(56) References Cited

U.S. PATENT DOCUMENTS

| | | | | |
|---|---|---|---|---|
| 3,444,547 A * | 5/1969 | Surek | ............................ | 340/650 |
| 5,572,186 A * | 11/1996 | Traxler et al. | ............ | 340/426.34 |
| 6,396,401 B1 * | 5/2002 | Matsuo | ...................... | 340/568.4 |
| 6,900,741 B1 * | 5/2005 | Warnelov | ...................... | 340/933 |
| 7,135,972 B2 * | 11/2006 | Bonato | ....................... | 340/568.2 |
| 7,209,038 B1 * | 4/2007 | Deconinck et al. | ......... | 340/568.8 |
| 7,626,500 B2 * | 12/2009 | Belden et al. | ............... | 340/568.1 |
| 7,667,601 B2 * | 2/2010 | Rabinowitz et al. | ........ | 340/568.2 |
| 7,724,135 B2 * | 5/2010 | Rapp et al. | .................. | 340/568.1 |
| 8,427,314 B2 * | 4/2013 | Billiard | ........................ | 340/568.1 |
| 8,698,617 B2 * | 4/2014 | Henson et al. | ............... | 340/539.1 |
| 8,847,759 B2 * | 9/2014 | Bisesti et al. | ............... | 340/568.1 |
| 2001/0022552 A1 * | 9/2001 | Maloney | ..................... | 340/568.1 |
| 2003/0052782 A1 * | 3/2003 | Maloney | ..................... | 340/568.4 |
| 2006/0164243 A1 * | 7/2006 | Ott | .................................. | 340/571 |
| 2009/0058643 A1 * | 3/2009 | Groth | .......................... | 340/568.1 |
| 2010/0045473 A1 * | 2/2010 | Frizzell | ......................... | 340/649 |
| 2010/0052907 A1 * | 3/2010 | Shannon et al. | ............ | 340/568.6 |

* cited by examiner

*Primary Examiner* — Jinhee Lee
*Assistant Examiner* — Keith DePew
(74) *Attorney, Agent, or Firm* — Clements Bernard PLLC; Christopher L. Bernard; Lawrence A. Baratta, Jr.

(57) ABSTRACT

The present invention provides an asset retention device, including: a housing including a base portion and an end portion, wherein the base portion and the end portion each include electrical contacts; and an asset attachment structure securely coupled to the end portion and the associated electrical contacts of the housing, thereby completing an electrical circuit through the asset attachment structure and the housing; wherein, if the continuity of the asset attachment structure is broken, the electrical circuit through the asset attachment structure and the housing is broken. The base portion of the housing is configured to be selectively coupled to a main console, such that the electrical circuit is present through the asset attachment structure, the housing, the base portion of the housing, and the main console. The main console includes a controller/processor operable for detecting a break in the continuity of the asset attachment structure and the associated electrical circuit.

15 Claims, 2 Drawing Sheets

ASSET RETENTION DEVICE FOR AN ASSET RETENTION SYSTEM

FIELD OF THE INVENTION

The present invention relates generally to asset retention systems, such as electronic systems for retaining keys and the like. More specifically, the present invention relates to an asset retention device, such as a key fob, asset holder, or the like, for use with such an asset retention system.

BACKGROUND OF THE INVENTION

A variety of electronic asset retention systems are known to those of ordinary skill in the art. For example, automobile dealerships, rental properties, and the like utilize a variety of electronic key retention systems that are operable for selectively identifying one or more keys from a plurality of keys, releasing the keys to an authorized user upon request, logging and/or tracking the use of the keys by the authorized user, and ensuring that the keys are eventually returned. In general, these asset retention systems include a plurality of asset retention devices that are coupled to some sort of main console. These asset retention devices then selectively releasably retain a plurality of assets, or are securely coupled to the plurality of assets and then are selectively released from the main console, either by mechanical, electrical, or electromechanical means. The main console includes appropriate circuitry and processing logic for performing all of the functions of the asset retention system, and communication links with external devices may be provided. Examples of such asset retention systems are provided in U.S. Pat. Nos. 6,505,754; 7,654,853; 7,852,214; 7,336,174; and 7,965,190; among others.

As an example, the asset retention device may be a key fob, asset holder, or the like, which holds a key or other asset on a ring and is selectively and releasably secured to the main console. The asset retention device includes an identifying chip or the like that allows the main console to detect the presence of and identify the asset retention device when it is coupled to the main console, and detect the absence of the asset retention device when it is removed from the main console. Disadvantageously, it is often possible to simply cut the ring and remove the key or other asset from the asset retention device. In such a case, the asset retention system still believes the asset is present because the asset retention device is still coupled to it. However, the asset has been removed from the asset retention device. A solution to this problem is still needed in the art.

BRIEF SUMMARY OF THE INVENTION

In one exemplary embodiment, the present invention provides an asset retention device, including: a housing including a base portion and an end portion, wherein the base portion and the end portion each include electrical contacts; and an asset attachment structure securely coupled to the end portion and the associated electrical contacts of the housing, thereby completing an electrical circuit through the asset attachment structure and the housing; wherein, if the continuity of the asset attachment structure is broken, the electrical circuit through the asset attachment structure and the housing is broken. The base portion of the housing is configured to be selectively coupled to a main console, such that the electrical circuit is present through the asset attachment structure, the housing, the base portion of the housing, and the main console. The main console includes a controller/processor operable for detecting a break in the continuity of the asset attachment structure and the associated electrical circuit. The asset retention device also includes an identifying chip for identifying the asset retention device. The asset attachment structure is configured to securely retain an asset. The asset attachment structure includes a conductive material.

In another exemplary embodiment, the present invention provides a method for providing an asset retention device, including: providing a housing including a base portion and an end portion, wherein the base portion and the end portion each include electrical contacts; and providing an asset attachment structure securely coupled to the end portion and the associated electrical contacts of the housing, thereby completing an electrical circuit through the asset attachment structure and the housing; wherein, if the continuity of the asset attachment structure is broken, the electrical circuit through the asset attachment structure and the housing is broken. The base portion of the housing is configured to be selectively coupled to a main console, such that the electrical circuit is present through the asset attachment structure, the housing, the base portion of the housing, and the main console. The main console includes a controller/processor operable for detecting a break in the continuity of the asset attachment structure and the associated electrical circuit. The method also includes providing an identifying chip for identifying the asset retention device. The asset attachment structure is configured to securely retain an asset. The asset attachment structure includes a conductive material.

In a further exemplary embodiment, the present invention provides an asset retention system, including: an asset retention device, including: a housing including a base portion and an end portion, wherein the base portion and the end portion each include electrical contacts; and an asset attachment structure securely coupled to the end portion and the associated electrical contacts of the housing, thereby completing an electrical circuit through the asset attachment structure and the housing; wherein, if the continuity of the asset attachment structure is broken, the electrical circuit through the asset attachment structure and the housing is broken. The base portion of the housing is configured to be selectively coupled to a main console, such that the electrical circuit is present through the asset attachment structure, the housing, the base portion of the housing, and the main console. The main console includes a controller/processor operable for detecting a break in the continuity of the asset attachment structure and the associated electrical circuit. The asset retention device also includes an identifying chip for identifying the asset retention device. The asset attachment structure is configured to securely retain an asset. The asset attachment structure includes a conductive material.

BRIEF DESCRIPTION OF THE DRAWINGS

The present invention is illustrated and described herein with reference to the various drawings, in which like reference numbers are used to denote like system/device components or method steps, as appropriate, and in which.

DETAILED DESCRIPTION OF THE INVENTION

Figure 1:
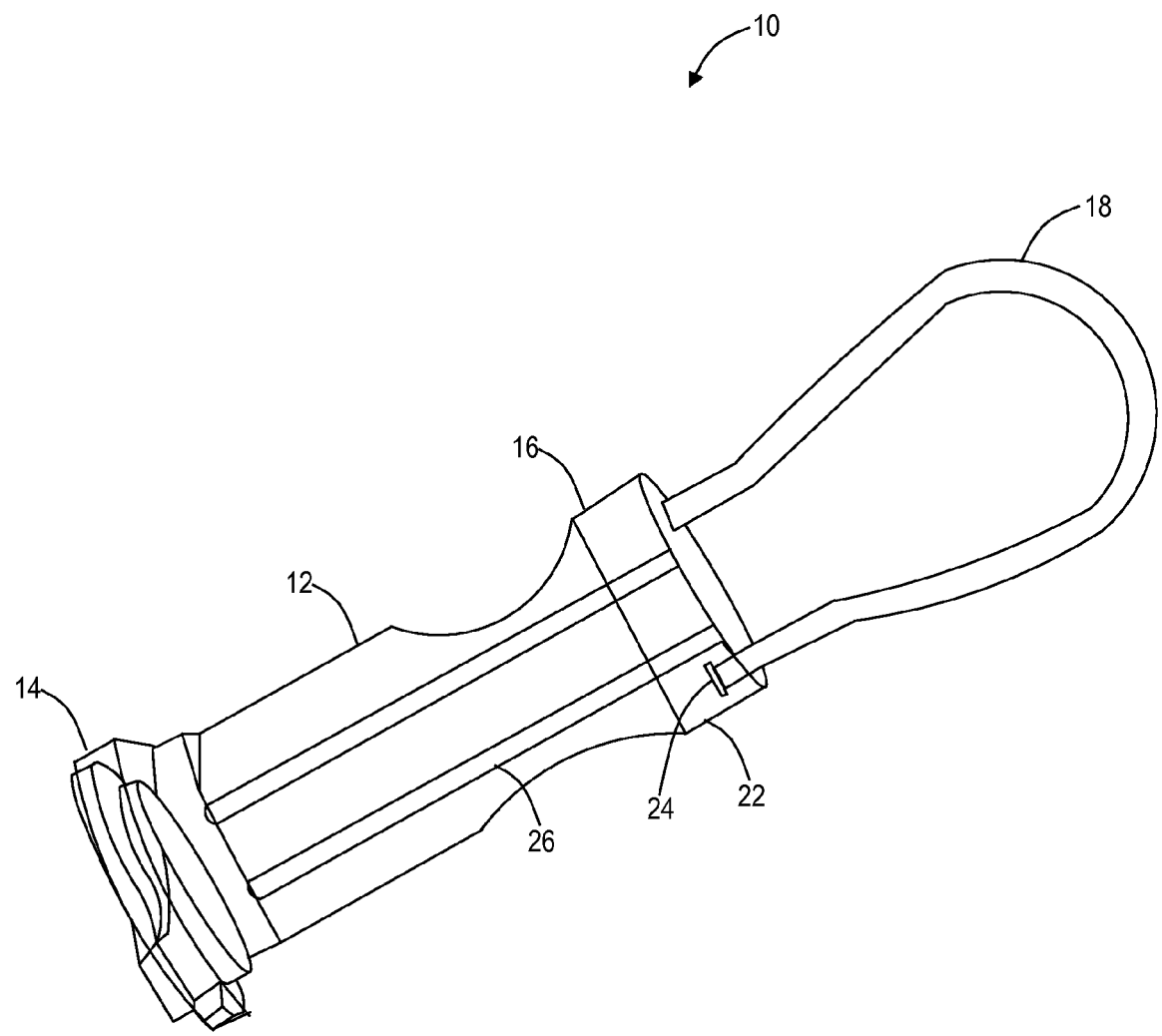
FIG. 1 is a semitransparent perspective view of one exemplary embodiment of the asset retention device of the present invention.
Figure 2:
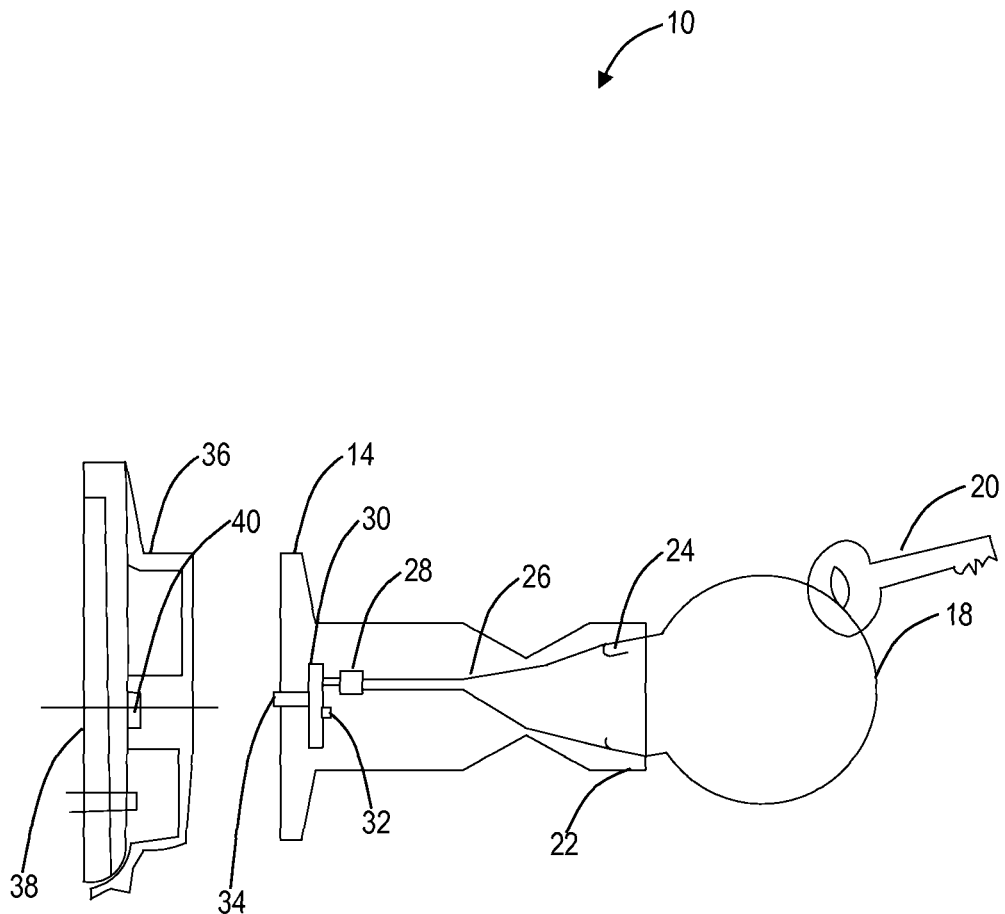
FIG. 2 is a semitransparent side view of one exemplary embodiment of the asset retention device of the present invention, including a retention assembly that is associated with the main console of an asset retention system (not illustrated).

Referring now to FIGS. 1 and 2, in one exemplary embodiment, the asset retention device 10 of the present invention includes a housing 12, a base structure 14, and an asset retention structure 16. In the exemplary embodiment illustrated, the housing 12, the base structure 14, and the asset retention structure 16 each consist of a concentric structure that is substantially hollow or defines one or more chambers therethrough, such that other components may be disposed within the housing 12, the base structure 14, and the asset retention structure 16, although it will be readily apparent to those of ordinary skill in the art that other configurations may be used as well. The housing 12, the base structure 14, and the asset retention structure 16 may be integrally formed or may consist of separate components that are joined.

The asset retention structure 16, or the housing itself 12, securely retains an asset attachment structure 18, such as a ring or loop, that is preferably made of metal or another material that is durable, difficult to cut, and conductive. Alternatively, the asset attachment structure 18 may be made of plastic or another material and include a corresponding metal wire, such that the overall asset attachment structure 18 is durable, difficult to cut, and conductive. Preferably, an asset 20 (FIG. 2) is coupled to the asset attachment structure 18 prior to the asset attachment structure 18 being assembled to the asset retention structure 16 and/or housing 12 itself. In this manner, once the asset 20 is coupled to the asset retention device 10, it may not be removed. In the exemplary embodiment illustrated, this is accomplished using a cap 22 through which widened or hooked ends of the asset attachment structure 18 pass. When the cap 22 is coupled and/or bonded to the asset retention device 10, the asset attachment structure 18 and asset 20 are essentially locked to the asset retention device 10. The widened or hooked ends of the asset attachment structure 18 form contacts 24 for electrical connections.

A pair of electrical wires 26 traverse the interior of the housing 12 and make electrical contact with the contacts 24 of the asset attachment structure, thereby forming an electrical circuit through the housing 12 and asset attachment structure 18. Accordingly, a ground circuit 28 may also be provided.

In the base structure 14, the electrical wires make electrical contact with a printed circuit board (PCB) 30 or the like, optionally via a plurality of pins or the like. The PCB 30 includes a chip 32 or the like that is programmed to identify the specific asset retention device 10 when it is coupled to the main console (not illustrated). Accordingly, the PCB 30 includes one or more contacts 34 (FIG. 2) for making electrical connection with the main console.

The main console includes an asset retention device holder 36 (FIG. 2) that includes a PCB 38 coupled to the controller/processor (not illustrated) of the main console. The PCB 38 of the holder 36 includes one or more contacts 40 that correspond to the one or more contacts 34 of the base structure 14. Thus, when the asset retention device 10 is coupled to the holder 36, a complete electrical circuit is formed through the holder 36, the body of the asset retention device 10, and the asset attachment structure 18.

If the asset attachment structure 18 is cut or broken in an attempt to remove the asset 20 from the asset retention device 10, the electrical circuit is broken and the main console will be aware of the absence of the asset 20. The main controller will also be aware of which asset is missing, due to the presence of the identifying chip 32.

It should be noted that the asset retention device 10 may be permanently affixed to the main console, with the asset attachment structure 18 protecting the associated asset, or, preferably, the asset retention device 10 may be removable from the main console, with the asset attachment structure essentially protecting the associated asset upon coupling of the asset retention device 10 to the main console.

Preferably, in the latter case, the asset retention device 10 is securely but releasably coupled to the holder 36, such that it may be removed by an authorized user upon authorization by the controller/processor of the main console. For example, the asset retention device 10 may be magnetically held by the holder 36, or it may be coupled via twisting or snapping and held by an appropriate selectively actuatable locking mechanism (not illustrated).

It should also be noted that, if the asset attachment structure 18 is cut or broken in an attempt to remove the asset 20 from the asset retention device, a number of alerts/alarms are triggered, including, audible, visual, text message, email message, etc. The system also identifies the person who logged in, the time, and within milliseconds of the device being tampered with, all of the alarms are activated and all of the information stored in a log/event file.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention, are contemplated thereby, and are intended to be covered by the following claims.

What is claimed is:

1. An asset retention device, comprising:
a housing comprising a base portion and an end portion, wherein the base portion and the end portion each comprise electrical contacts; and
an asset attachment structure securely coupled to the end portion and the associated electrical contacts of the housing, thereby completing an electrical circuit through the asset attachment structure and the housing;
wherein, if the continuity of the asset attachment structure is broken, the electrical circuit through the asset attachment structure and the housing is broken;
wherein the base portion of the housing and asset attachment structure are configured to be selectively rotatably coupled to a holder, such that the electrical circuit is present through the asset attachment structure, the housing, the base portion of the housing, and the holder when the base portion of the housing and asset attachment structure are rotatably coupled to the holder; and
wherein the base portion of the housing and asset attachment structure are configured to be selectively rotatably removed from the holder only upon authorization by a controller/processor coupled to the holder.

2. The asset retention device of claim 1, wherein the controller/processor is operable for detecting a break in the continuity of the asset attachment structure and the associated electrical circuit.

3. The asset retention device of claim 1, further comprising an identifying chip for identifying the asset retention device.

4. The asset retention device of claim 1, wherein the asset attachment structure is configured to securely retain an asset.

5. The asset retention device of claim 1, wherein the asset attachment structure comprises a conductive material.

6. A method for providing an asset retention device, comprising:
providing a housing comprising a base portion and an end portion, wherein the base portion and the end portion each comprise electrical contacts; and
providing an asset attachment structure securely coupled to the end portion and the associated electrical contacts of the housing, thereby completing an electrical circuit through the asset attachment structure and the housing;

wherein, if the continuity of the asset attachment structure is broken, the electrical circuit through the asset attachment structure and the housing is broken;

wherein the base portion of the housing and asset attachment structure are configured to be selectively rotatably coupled to a holder, such that the electrical circuit is present through the asset attachment structure, the housing, the base portion of the housing, and the holder when the base portion of the housing and asset attachment structure are rotatably coupled to the holder; and wherein the base portion of the housing and asset attachment structure are configured to be selectively rotatably removed from the holder only upon authorization by a controller/processor coupled to the holder.

7. The method for providing an asset retention device of claim 6, wherein the controller/processor is operable for detecting a break in the continuity of the asset attachment structure and the associated electrical circuit.

8. The method for providing an asset retention device of claim 6, further comprising providing an identifying chip for identifying the asset retention device.

9. The method for providing an asset retention device of claim 6, wherein the asset attachment structure is configured to securely retain an asset.

10. The method for providing an asset retention device of claim 6, wherein the asset attachment structure comprises a conductive material.

11. An asset retention system, comprising:
an asset retention device, comprising:
  a housing comprising a base portion and an end portion, wherein the base portion and the end portion each comprise electrical contacts; and
  an asset attachment structure securely coupled to the end portion and the associated electrical contacts of the housing, thereby completing an electrical circuit through the asset attachment structure and the housing;
  wherein, if the continuity of the asset attachment structure is broken, the electrical circuit through the asset attachment structure and the housing is broken; and
a holder;
wherein the base portion of the housing and asset attachment structure are configured to be selectively rotatably coupled to the holder, such that the electrical circuit is present through the asset attachment structure, the housing, the base portion of the housing, and the holder when the base portion of the housing and asset attachment structure are rotatably coupled to the holder; and
wherein the base portion of the housing and asset attachment structure are configured to be selectively rotatably removed from the holder only upon authorization by a controller/processor coupled to the holder.

12. The asset retention system of claim 11, wherein the controller/processor is operable for detecting a break in the continuity of the asset attachment structure and the associated electrical circuit.

13. The asset retention system of claim 11, further comprising an identifying chip for identifying the asset retention device.

14. The asset retention system of claim 11, wherein the asset attachment structure is configured to securely retain an asset.

15. The asset retention system of claim 11, wherein the asset attachment structure comprises a conductive material.

* * * * *